United States Patent
Takahashi

(10) Patent No.: US 8,053,036 B2
(45) Date of Patent: Nov. 8, 2011

(54) METHOD FOR DESIGNING SHOWER PLATE FOR PLASMA CVD APPARATUS

(75) Inventor: Satoshi Takahashi, Tama (JP)

(73) Assignee: ASM Japan K.K., Tokyo (JP)

( * ) Notice: Subject to any disclaimer, the term of this patent is extended or adjusted under 35 U.S.C. 154(b) by 924 days.

(21) Appl. No.: 12/039,699

(22) Filed: Feb. 28, 2008

(65) Prior Publication Data

US 2009/0299701 A1 Dec. 3, 2009

(51) Int. Cl.
- *H05H 1/24* (2006.01)
- *H01L 21/306* (2006.01)
- *H01L 21/44* (2006.01)
- *C23C 16/00* (2006.01)

(52) U.S. Cl. ............ 427/569; 118/723 E; 118/723 MW; 156/345.47; 156/345.31; 438/680

(58) Field of Classification Search ................ 427/8, 58, 427/569; 118/728, 723 MW
See application file for complete search history.

(56) References Cited

U.S. PATENT DOCUMENTS

| | | | |
|---|---|---|---|
| 6,631,692 B1 * | 10/2003 | Matsuki et al. | ........... 118/723 E |
| 6,692,576 B2 | 2/2004 | Halpin et al. | |
| 7,418,921 B2 | 9/2008 | Tsuji et al. | |
| 2007/0037390 A1 | 2/2007 | Tsuji et al. | |

FOREIGN PATENT DOCUMENTS

| | | |
|---|---|---|
| JP | 3207147 | 7/2001 |
| WO | WO 0208487 A1 * | 1/2002 |

OTHER PUBLICATIONS

Naoto Tsuji et al., Plasma CVD Film-Forming Device, Invention Association Publication No. 2002-1338, issued Mar. 1, 2002, pp. 1-2.

* cited by examiner

*Primary Examiner* — Dah-Wei Yuan
*Assistant Examiner* — Jose Hernandez-Diaz
(74) *Attorney, Agent, or Firm* — Knobbe Martens Olson & Bear LLP

(57) ABSTRACT

A method of designing a shower plate for a plasma CVD apparatus includes (a) providing a shower plate having a convex surface configured by a convex equation; (b) forming a film on a wafer using the shower plate in the plasma CVD apparatus; (c) determining a distribution of thickness of the film formed on the wafer by dividing a diametrical cross section of the film into multiple regions; (d) determining at least one secondary equation; and (e) designing a surface configuration of the shower plate by overlaying the secondary equation on the convex equation.

18 Claims, 3 Drawing Sheets

METHOD FOR DESIGNING SHOWER PLATE FOR PLASMA CVD APPARATUS

BACKGROUND OF THE INVENTION

1. Field of the Invention

The present invention relates to a method for determining the shape of a shower plate for a semiconductor manufacturing apparatus.

2. Description of the Related Art

Traditionally, uniformity has been improved by means of changing the process conditions and hardware. However, changing the process conditions significantly limits usable conditions under which the target film thickness can be satisfied, while introducing new hardware causes the quality of formed film to change, thus resulting in the required film thickness not being satisfied.

Attempts have also been made to improve uniformity by changing the shape of a shower plate or other electrode in a manner similar to what is proposed by the present invention. In these cases, however, the shape is determined empirically and many prototypes must be created so that a shape showing favorable results is selected and used, which adds to the development cost.

SUMMARY OF THE INVENTION

After diligent studies on changes in shower plate shape as a means for improving uniformity alone, the inventors found a method for designing the shape of a shower plate to control uniformity, without changing the film forming conditions, when in-plane uniformity of film thickness is to be improved. This discovery led to the present invention.

To be specific, in an embodiment of the present invention the main process is such that the surface of a shower plate is divided into multiple regions including convex, concave and roughly flat regions, and these regions are defined by points of intersection with the average thickness line and then quadratic functions in opposite directions are prepared for the concave and convex regions to be superimposed on the base function of the shower plate. This adjustment using quadratic functions may be performed only once, or repeated twice or more. Although the shape of a susceptor used in the forming of film is not specifically limited, the susceptor disclosed in U.S. patent application Ser. No. 11/202,492 filed on Aug. 12, 2005 by the applicants (assignee) for the present application for patent can be combined (the disclosure of which is incorporated herein by reference in its entirety).

In an embodiment wherein one or more of the objects described in the present disclosure can be achieved, the present invention provides a method of designing a shower plate for a plasma CVD apparatus comprising: (a) providing a shower plate having a convex surface configured by a convex equation; (b) forming a film on a wafer using the shower plate in the plasma CVD apparatus; (c) determining a distribution of thickness of the film formed on the wafer by dividing a diametrical cross section of the film into multiple regions; (d) determining at least one secondary equation; and (e) designing a surface configuration of the shower plate by overlaying the secondary equation on the convex equation.

In another embodiment, the present invention provides a method of designing a shower plate for a plasma CVD apparatus wherein a wafer is placed on a susceptor, above which the shower plate is disposed substantially in parallel for discharging a gas therethrough and generating a plasma between the susceptor and the shower plate, comprising: (a) providing a shower plate having a convex surface configured by a convex equation L which is a function of a radius R: (b) forming a film on a wafer using the shower plate in the plasma CVD apparatus; (c) determining a distribution of thickness of the film formed on the wafer by dividing a diametrical cross section of the film into multiple regions including a concave region wherein the thickness of the film is smaller than an average thickness of the film, a convex region wherein the thickness of the film is greater than the average thickness of the film, and an even region wherein the thickness of the film is substantially even with the average thickness of the film, wherein boundaries between the multiple regions are disposed on a straight line representing the diametrical average thickness of the film as viewed on a graph on the diametrical cross section; (d) determining a secondary equation M1 which has a highest vertex point aligned with a lowest point of the concave region as viewed on the graph in a direction perpendicular to the diametrical direction and which intercepts the straight line on the graph; (e) determining a secondary equation M2 which has a lowest vertex point aligned with a highest point of the convex region as viewed on the graph in a direction perpendicular to the diametrical direction and which intercepts the straight line on the graph; and (f) designing a surface configuration of the shower plate by (I) overlaying the secondary equation M1 on the equation L in a region corresponding to the concave region as viewed on the graph on the diametrical cross section by moving the secondary equation M1 in a direction perpendicular to the diametrical direction so that a point where the secondary equation M1 intercepts the straight line is on the equation L on the graph; and (II) overlaying the secondary equation M2 on the equation L in a region corresponding to the convex region as viewed on the graph on the diametrical cross section by moving the secondary equation M2 in a direction perpendicular to the diametrical direction so that a point where the secondary equation M2 intercepts the straight line is on the equation L on the graph.

In still another embodiment, the present invention provides a method of producing a shower plate for a plasma CVD apparatus comprising: (A) designing a shower plate by any one of the foregoing designing methods; and (B) producing the shower plate having the designed surface configuration.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
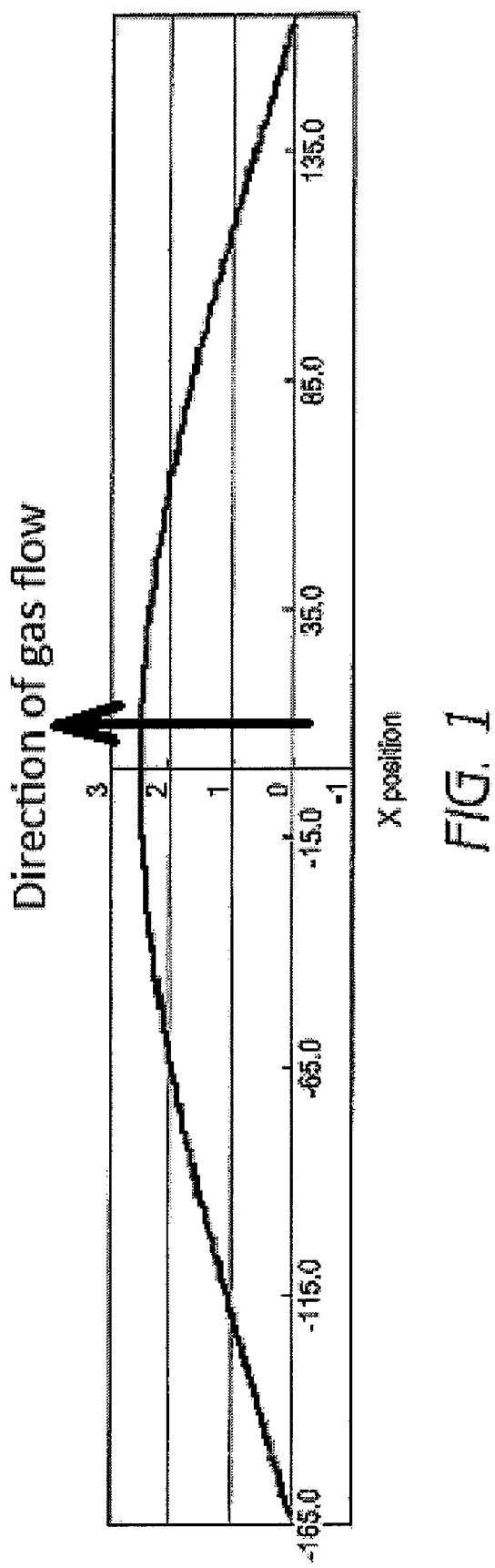
FIG. 1 is a schematic diagram showing a comparative or standard configuration of a shower plate.

As described above, in an embodiment of the present invention, a method of designing a shower plate for a plasma CVD apparatus comprises: (a) providing a shower plate having a convex surface configured by a convex equation L which is a function of a radius R: (b) forming a film on a wafer using the shower plate in the plasma CVD apparatus; (c) determining a distribution of thickness of the film formed on the wafer by dividing a diametrical cross section of the film into multiple regions including a concave region wherein the thickness of the film is smaller than an average thickness of the film, a convex region wherein the thickness of the film is greater than the average thickness of the film, and an even region wherein the thickness of the film is substantially even with the average thickness of the film, wherein boundaries between the multiple regions are disposed on a straight line representing the diametrical average thickness of the film as viewed on a graph on the diametrical cross section; (d) determining a secondary equation M1 which has a highest vertex point aligned with a lowest point of the concave region as viewed on the graph in a direction perpendicular to the diametrical direction and which intercepts the straight line on the graph; (e) determining a secondary equation M2 which has a lowest vertex point aligned with a highest point of the convex region as viewed on the graph in a direction perpendicular to the diametrical direction and which intercepts the straight line on the graph; and (f) designing a surface configuration of the shower plate by (I) overlaying the secondary equation M1 on the equation L in a region corresponding to the concave region as viewed on the graph on the diametrical cross section by moving the secondary equation M1 in a direction perpendicular to the diametrical direction so that a point where the secondary equation M1 intercepts the straight line is on the equation L on the graph; and (II) overlaying the secondary equation M2 on the equation L in a region corresponding to the convex region as viewed on the graph on the diametrical cross section by moving the secondary equation M2 in a direction perpendicular to the diametrical direction so that a point where the secondary equation M2 intercepts the straight line is on the equation L on the graph.

The above embodiment further includes, but is not limited to, at least one of the following embodiments:

In an embodiment, the method may further comprise repeating steps (b)-(f) one or more times until the distribution of the film is satisfactory, wherein a curve of the vertex point of the secondary equation M1 and/or M2 is adjusted each time before repeating steps (b)-(f).

In another embodiment, the method may further comprise: (g) forming a film on a wafer using the shower plate having the designed surface configuration in the plasma CVD apparatus; (h) determining a distribution of thickness of the film formed on the wafer in the multiple regions; and (i) repeating steps (d)-(h) one or more times until the distribution of the film is satisfactory, wherein a curve of the vertex point of the secondary equation M1 and/or M2 is adjusted each time before repeating steps (d)-(h).

In still another embodiment, the method may further comprise: (g) forming a film on a wafer using the shower plate having the designed surface configuration in the plasma CVD apparatus; (h) determining a distribution of thickness of the film formed on the wafer in the multiple regions; and (i) if the distribution of thickness of the film is not satisfactory, further modifying the surface configuration of the shower plate by sharpening a curve at the vertex point of the region in which deviation of thickness of the film is smaller than that of the film formed using the shower plate having the surface configuration to be modified in this step, and decreasing a curve at the vertex point of the region in which deviation of thickness of the film is larger than that of the film formed using the shower plate having the surface configuration to be modified in this step.

In any one of the foregoing embodiments, the method may further comprise repeating steps (g)-(i) until the distribution of the film is satisfactory.

In any one of the foregoing embodiment, the secondary equations M1 and M2 may be a function of R to the second power. In an embodiment, each of the secondary equation M1 and M2 may be expressed by $$M = h\left(1 - \frac{(R-j)^2}{i}\right),$$

wherein h, i, and j are coefficients.

In any one of the foregoing embodiments, the equation L is expressed by $$L = \frac{e^2 f}{R^2 + e^2} - \frac{e^2 f}{g^2 + e^2},$$

wherein e, f, and g are constants.

In any one of the foregoing embodiments, the equation L may be such that a height of a convex portion of the shower plate at a center is about 0.5 mm to about 3.5 mm.

In another aspect, the present invention is applied equally to a method of producing a shower plate for a plasma CVD apparatus wherein a wafer is placed on a susceptor, above which the shower plate is disposed substantially in parallel for discharging a gas therethrough and generating a plasma between the susceptor and the shower plate. In an embodiment, the method may comprise: (A) designing a shower plate by any one of the foregoing methods: and (B) producing the shower plate having the designed surface configuration.

In the present disclosure where conditions and/or structures are not specified, the skilled artisan in the art can readily provide such conditions and/or structures, in view of the present disclosure, as a matter of routine experimentation. For example, the designing method shown in U.S. patent application Ser. No. 11/202,492, filed Aug. 12, 2005, owned by the same assignee as in the present application can be employed in at least one embodiment of the present invention, and the disclosure of which is incorporated herein by reference in its entirety.

The present invention will be explained in detail with respect to preferred embodiments. However, the preferred embodiments are not intended to limit the present invention. In the present disclosure, the numerical numbers applied in embodiments can be modified by a range of at least ±50% in other embodiments, and the ranges applied in embodiments may include or exclude the endpoints.

FIG. 1 shows the base shower plate shape. Shown below is an example of results of forming film under a set of conditions where a desired film thickness can be obtained using this shape.

Film Forming Conditions
　　First electrode: 170° C.
　　Chamber wall: 150° C.
　　Heater: 390° C.
　　Material gas: DM-DMOS (dimethyl dimethoxy silane), 190 sccm
　　Additive gas: He, 150 sccm
　　First RF power supply: 27.12 MHz, 3.5 W/cm$^2$
　　Wafer: 300 mm
Film Characteristics
　　Thickness (A): 10400
　　Range (A): 856
　　Uniformity (1 s %): 1.94
　　Deposition Rate (A/sec): 126.0
　　R.I. (Refractive Index): 1.4463
　　Stress (MPa): 47.4
　　k-value (dielectric constant): 2.93
　　Hardness (GPa): 2.06
　　Elastic Modulus (GPa): 12.33

From the above data, it is found that the shower plate shape shown in FIG. 1 did not provide favorable values in terms of uniformity of film thickness.

Figure 2:
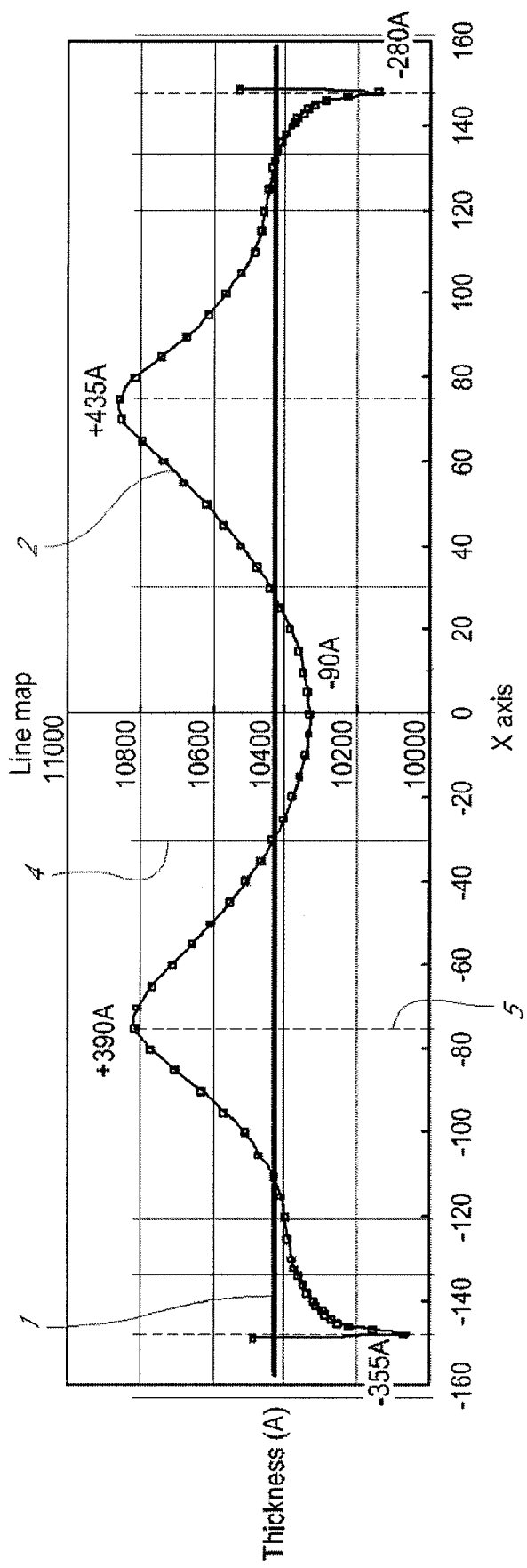
FIG. 2 is a schematic diagram showing a measured thickness distribution and an average thickness of a film deposited using the shower plate shown in FIG. 1.

FIG. 2 is a "line map" showing a film thickness distribution in the wafer diametrical direction with respect to the film thickness of the wafer when using the shower plate shown in FIG. 1. When determining a shower plate shape, it is desirable to use a line map providing a lot of numerical information, but other method having equivalent effects can also be used. In FIG. 2, plotted line 2 represents the actual film thickness, while straight line 1 represents the average film thickness of this sample. In this figure, vertical line 4 is drawn to each point of intersection between plotted line 2 representing the actual film thickness and straight line 1 representing the average film thickness of the sample, or near such point of intersection (in this example, three vertical lines are drawn in a radial direction, or six lines along the diametrical cross-section). This way, four sections are created that provide concentric circles with respect to the center (these sections are designated as sections 1, 2, 3 and 4 from the one nearest the center, toward the outside). These sections are classified into a section where formed film is thicker than the average (section 2), a section where formed film is roughly equivalent to the average (section 3), and sections where formed film is thinner than the average (sections 1 and 4). Depending on the embodiment, a desired number of divided sections can be selected as deemed appropriate. For example, 3 sections, 5 sections, 6 sections, 7 sections, 8 sections, 9 sections or 10 sections can be created, among others. For your information, vertical fine 5 represents the apex of the convex.

In this process, widening the distance between electrodes increases the film deposition rate, while shortening the distance between electrodes decreases the film deposition rate. Accordingly, a concave-down function is applied to sections 1 and 4, while a concave-up function is applied to section 2. No corrective function is applied to section 3, because there is little difference between the actual thickness and the average in this section. It should also be noted that, when the trend is the same but the deviation from the average is different, as is the case with sections 1 and 4, flat film can be formed by increasing or decreasing the amount of concave of the corrective function.

Figure 3:
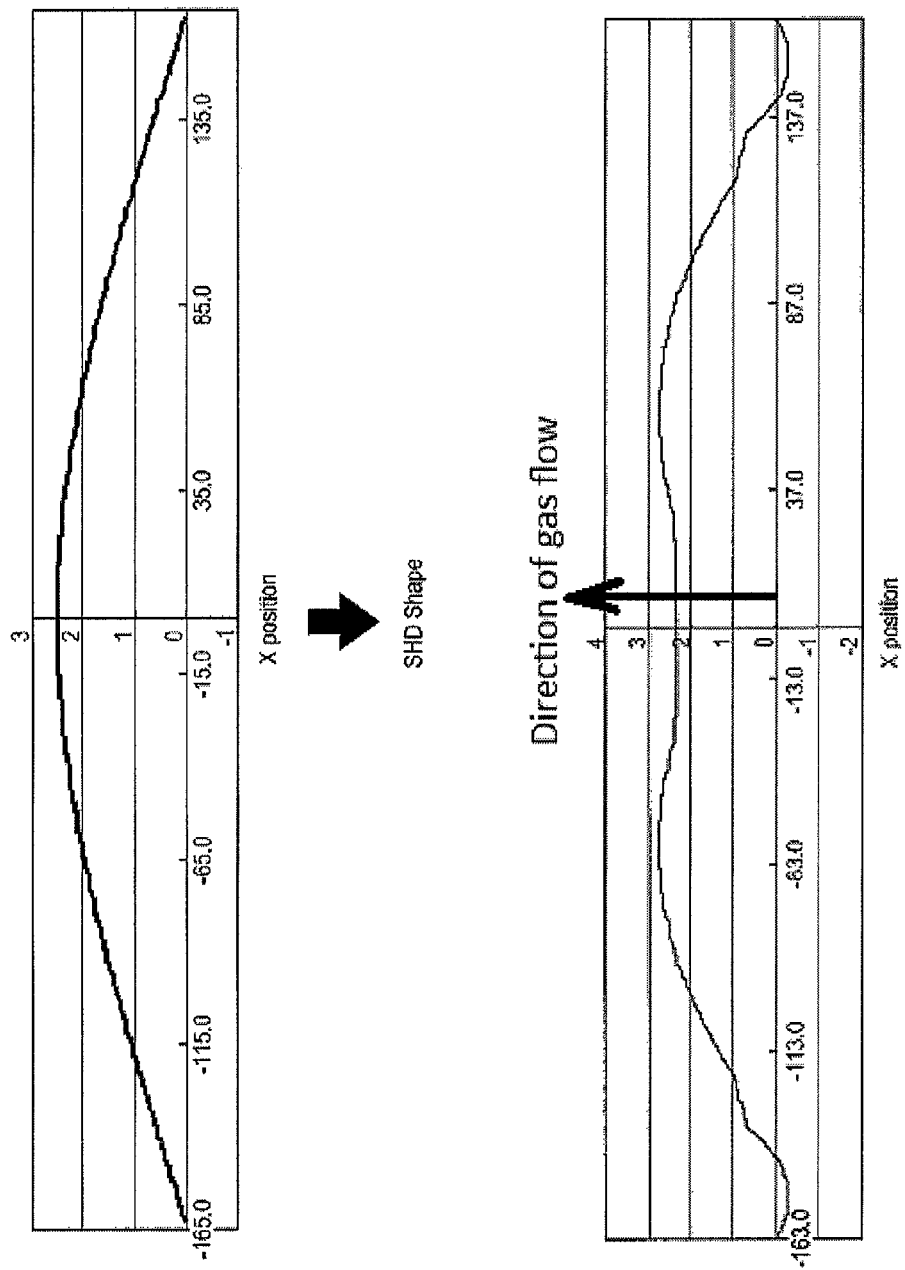
FIG. 3 is a schematic diagram showing a configuration of a shower plate according to an embodiment of the present invention, in comparison with that of the shower plate shown in FIG. 1.

FIG. 3 shows a new shower plate shape obtained by applying a concave-up or concave-down function to the applicable sections of the base shower plate according to the shape of each section illustrated in FIG. 2.

Here, the base function of the shower plate is expressed by the formula below to represent a base convex shape with a height of 2.5 mm at the center of the shower plate:

$$Zs = L - M$$
$$L = \frac{e^2 f}{R^2 + e^2} - \frac{e^2 f}{g^2 + e^2}$$
$$M = 0$$

Here, Zs indicates the height, R indicates the radius ($0 \leq R \leq 163$), while e, f and g are constants (e=266, f=9.15, g=163). As for these constants, desired values can be selected as deemed appropriate based on the base shape of the susceptor to be obtained. M is a superimposed quadratic function and becomes "0" for the base shape. When R satisfies "$163 \leq R \leq 175$," Zs becomes "0".

The following three types of functions were used as the specific quadratic function (M in the above formula) to create the shape shown in FIG. 3:

$$Y = -0.6/225(|X|-148)^2 + 0.6 \ (133 \leq |X| \leq 163)$$

$$Y = 0.8/2025(|X|-75)^2 - 0.8 \ (30 \leq |X| < 120)$$

$$Y = -0.2/900|X|^2 + 0.2 \ (|X| < 30)$$

In this case, the shape in FIG. 3 was obtained by superimposing the quadratic functions only once. The final shower plate shape can be obtained by superimposing these functions on the base function.

It is also possible to obtain the shape by superimposing functions repeatedly in the same method. To be specific, the second and subsequent corrections are implemented based on the film resulting from the first correction. When the film thickness is checked and quadratic functions are applied repeatedly to make adjustments, the point of intersection between each quadratic function and the average film thickness line may deviate slightly with each application. In this case, the regions can be redefined using the deviated points of intersection each time and then quadratic functions are applied to make adjustment, or the initially defined regions can be fixed so that subsequent adjustments are made using quadratic functions based on the fixed regions. The region definition is not fixed when the profile of the film draws a concave or convex curve across the initially defined regions, while the region definition is fixed when the change made initially is found excessive or insufficient.

A shower plate of the shape obtained in FIG. 3 was actually created and this shower plate was used on a semiconductor manufacturing apparatus to form film. The results are shown below.

Film Characteristics
　　Thickness (A): 10343
　　Range (A): 332
　　Uniformity (1 s %): 0.83
　　Deposition Rate (A/sec): 125.3
　　R.I. (Refractive Index): 1.4407
　　Stress (MPa): 47.9
　　k-value (dielectric constant): 2.93
　　Hardness (GPa): 2.11
　　Elastic Modulus (GPa): 12.49

When compared to the base shape described above, this shape is prominently different in the following points.

|  | Standard | Embodiment |
|---|---|---|
| Thickness (A) | 10400 | 10343 |
| Range (A) | 856 | 333 |
| Uniformity (1s %) | 1.94 | 0.83 |

As shown in the table above, use of the shower plate designed in the example of the present invention produced significant improvement to the uniformity of film thickness (film uniformity became less than 1%, or less than a half of the level achieved with the base shape). In other words, the shower plate according to this example provides markedly improved uniformity, while other properties of film quality are equivalent to those of the base shower plate.

For your information, the significant lateral difference in FIG. 2 can be adjusted as follows. If the shower plate shape is corrected based on the actual film thickness, the shower plate shape can be designed as a concentric circle. The specific steps are as follows: 1) Since data is acquired in both the X-axis direction and Y-axis direction on the line map (line distribution of film thickness) used in design, use the set of data with the smaller slope; 2) if an unacceptable slope still remains, measure the regions and amounts of convex/concave on the right side and left side of the wafer center, and then use the calculated average to determine each region to apply a corrective function to, and the amount of correction, and apply the obtained results to the base shower plate function.

When the surface is divided into multiple regions including convex, concave and roughly flat regions, and quadratic functions are prepared for these regions and superimposed on the base function, sometimes discontinuity occurs at the region boundaries. In an embodiment, no function is applied to these discontinuous parts nor R specified for machining (these methods may be used in other embodiments); that is, discontinuous parts remain on the actual shower plate as machined. In reality, however, convexes/concaves are only approx. 3 mm in size based on a circle of approx. 350 mm in diameter, and thus these parts will seldom create problems in actual forming of film.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of designing and producing a shower plate for a plasma CVD apparatus wherein a wafer is placed on a susceptor, above which the shower plate is disposed substantially in parallel for discharging a gas therethrough and generating a plasma between the susceptor and the shower plate, comprising:

(a) providing a shower plate having a convex surface configured by a convex equation L which is a function of a radius R;

(b) obtaining uniformity data of thickness of a film formed on a wafer placed on the susceptor using the shower plate in the plasma CVD apparatus;

(c) determining a distribution of thickness of the film formed on the wafer by dividing a diametrical cross section of the film into multiple regions including a concave region wherein the thickness of the film is smaller than an average thickness of the film, a convex region wherein the thickness of the film is greater than the average thickness of the film, and an even region wherein the thickness of the film is substantially even with the average thickness of the film, wherein boundaries between the multiple regions are disposed on a straight line representing the diametrical average thickness of the film as viewed on a graph on the diametrical cross section;

(d) determining a secondary equation M1 which has a highest vertex point aligned with a lowest point of the concave region as viewed on the graph in a direction perpendicular to the diametrical direction and which intercepts the straight line on the graph;

(e) determining a secondary equation M2 which has a lowest vertex point aligned with a highest point of the convex region as viewed on the graph in a direction perpendicular to the diametrical direction and which intercepts the straight line on the graph;

(f) designing a surface configuration of the shower plate by (I) overlaying the secondary equation M1 on the equation L in a region corresponding to the concave region as viewed on the graph on the diametrical cross section by moving the secondary equation M1 in a direction perpendicular to the diametrical direction so that a point where the secondary equation M1 intercepts the straight line is on the equation L on the graph; and (II) overlaying the secondary equation M2 on the equation L in a region corresponding to the convex region as viewed on the graph on the diametrical cross section by moving the secondary equation M2 in a direction perpendicular to the diametrical direction so that a point where the secondary equation M2 intercepts the straight line is on the equation L on the graph; and (j) producing a shower plate having the surface configuration designed in step (f).

2. The method according to claim 1, further comprising repeating steps (b)-(f) one or more times until the distribution of the film is improved, wherein a curve of the vertex point of the secondary equation M1 and/or M2 is adjusted each time before repeating steps (b)-(f).

3. The method according to claim 1, further comprising:

(g) forming a film on a wafer using the shower plate having the designed surface configuration in the plasma CVD apparatus;

(h) determining a distribution of thickness of the film formed on the wafer in the multiple regions; and (i) repeating steps (d)-(h) one or more times until the distribution of the film is improved, wherein a curve of the vertex point of the secondary equation M1 and/or M2 is adjusted each time before repeating steps (d)-(h).

4. The method according to claim 1, further comprising:

(g) forming a film on a wafer using the shower plate having the designed surface configuration in the plasma CVD apparatus;

(h) determining a distribution of thickness of the film formed on the wafer in the multiple regions; and (i) if the distribution of thickness of the film is not improved, further modifying the surface configuration of the shower plate by sharpening a curve at the vertex point of the region in which deviation of thickness of the film is smaller than that of the film formed using the shower plate having the surface configuration to be modified in this step, and decreasing a curve at the vertex point of the region in which deviation of thickness of the film is larger than that of the film formed using the shower plate having the surface configuration to be modified in this step.

5. The method according to claim 4, further comprising repeating steps (g)-(i) until the distribution of the film is improved.

6. The method according to claim 1, wherein the secondary equations M1 and M2 are a function of R to the second power.

7. The method according to claim 6, wherein each of the secondary equation M1 and M2 is expressed by $$M = h\left(1 - \frac{(R-j)^2}{i}\right),$$

wherein h, i, and j are coefficients.

8. The method according to claim 1, wherein the equation L is expressed by $$L = \frac{e^2 f}{R^2 + e^2} - \frac{e^2 f}{g^2 + e^2},$$

wherein e, f, and g are constants.

9. The method according to claim 1, wherein the equation L is such that a height of a convex portion of the shower plate at a center is about 0.5 mm to about 3.5 mm.

10. A method of producing a shower plate for a plasma CVD apparatus wherein a wafer is placed on a susceptor, above which the shower plate is disposed substantially in parallel for discharging a gas therethrough and generating a plasma between the susceptor and the shower plate, comprising:

(A) designing a shower plate by a method comprising:
(a) providing a shower plate having a convex surface configured by a convex equation L which is a function of a radius R;
(b) forming a film on a wafer using the shower plate in the plasma CVD apparatus;
(c) determining a distribution of thickness of the film formed on the wafer by dividing a diametrical cross section of the film into multiple regions including a concave region wherein the thickness of the film is smaller than an average thickness of the film, a convex region wherein the thickness of the film is greater than the average thickness of the film, and an even region wherein the thickness of the film is substantially even with the average thickness of the film, wherein boundaries between the multiple regions are disposed on a straight line representing the diametrical average thickness of the film as viewed on a graph on the diametrical cross section;
(d) determining a secondary equation M1 which has a highest vertex point aligned with a lowest point of the concave region as viewed on the graph in a direction perpendicular to the diametrical direction and which intercepts the straight line on the graph;
(e) determining a secondary equation M2 which has a lowest vertex point aligned with a highest point of the convex region as viewed on the graph in a direction perpendicular to the diametrical direction and which intercepts the straight line on the graph; and
(f) designing a surface configuration of the shower plate by (I) overlaying the secondary equation M1 on the equation L in a region corresponding to the concave region as viewed on the graph on the diametrical cross section by moving the secondary equation M1 in a direction perpendicular to the diametrical direction so that a point where the secondary equation M1 intercepts the straight line is on the equation L on the graph; and (II) overlaying the secondary equation M2 on the equation L in a region corresponding to the convex region as viewed on the graph on the diametrical cross section by moving the secondary equation M2 in a direction perpendicular to the diametrical direction so that a point where the secondary equation M2 intercepts the straight line is on the equation L on the graph; and (B) producing the shower plate having the designed surface configuration.

11. The method according to claim 10, further comprising repeating steps (b)-(f) one or more times until the distribution of the film is improved, wherein a curve of the vertex point of the secondary equation M1 and/or M2 is adjusted each time before repeating steps (b)-(f).

12. The method according to claim 10, further comprising:
(g) forming a film on a wafer using the shower plate having the designed surface configuration in the plasma CVD apparatus;
(h) determining a distribution of thickness of the film formed on the wafer in the multiple regions; and
(i) repeating steps (d)-(h) one or more times until the distribution of the film is improved, wherein a curve of the vertex point of the secondary equation M1 and/or M2 is adjusted each time before repeating steps (d)-(h).

13. The method according to claim 10, further comprising:
(g) forming a film on a wafer using the shower plate having the designed surface configuration in the plasma CVD apparatus;
(h) determining a distribution of thickness of the film formed on the wafer in the multiple regions; and
(i) if the distribution of thickness of the film is not improved, further modifying the surface configuration of the shower plate by sharpening a curve at the vertex point of the region in which deviation of thickness of the film is smaller than that of the film formed using the shower plate having the surface configuration to be modified in this step, and decreasing a curve at the vertex point of the region in which deviation of thickness of the film is larger than that of the film formed using the shower plate having the surface configuration to be modified in this step.

14. The method according to claim 13, further comprising repeating steps (g)-(i) until the distribution of the film is improved.

15. The method according to claim 10, wherein the secondary equations M1 and M2 are a function of R to the second power.

16. The method according to claim 15, wherein each of the secondary equation M1 and M2 is expressed by $$M = h\left(1 - \frac{(R-j)^2}{i}\right),$$

wherein h, i, and j are coefficients.

17. The method according to claim 10, wherein the equation L is expressed by $$L = \frac{e^2 f}{R^2 + e^2} - \frac{e^2 f}{g^2 + e^2},$$

wherein e, f, and g are constants.

18. The method according to claim 10, wherein the equation L is such that a height of a convex portion of the shower plate at a center is about 0.5 mm to about 3.5 mm.

* * * * *